(12) United States Patent
Honma

(10) Patent No.: US 6,819,424 B1
(45) Date of Patent: Nov. 16, 2004

(54) EXPOSURE DEVICE FOR A STRIP-SHAPED WORKPIECE

(75) Inventor: Jyun Honma, Machida (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/492,838

(22) Filed: Jan. 27, 2000

(30) Foreign Application Priority Data

Jan. 25, 1999 (JP) ............................ 11-015488

(51) Int. Cl.$^7$ .............................................. G01B 11/00
(52) U.S. Cl. ...................................................... 356/399
(58) Field of Search ......................................... 356/399

(56) References Cited

FOREIGN PATENT DOCUMENTS

JP        9-230610        9/1997

*Primary Examiner*—Frank G. Font
*Assistant Examiner*—Andrew H. Lee

(74) *Attorney, Agent, or Firm*—Nixon Peabody LLP; David S. Safran

(57) ABSTRACT

A device for exposing several rows of mask patterns on a strip-shaped workpiece without the device becoming larger and the rolls having to be replaced is achieved as follows: A strip-shaped workpiece is transported. When a first exposure area of the first row reaches a projection site on a workpiece carrier (3), the strip-shaped workpiece (Wb) is held by vacuum. A mask (M) is positioned relative to the strip-shaped workpiece and the first exposure area is exposed. Then, the strip-shaped workpiece is held by the workpiece suction devices (8, 8'). The movement devices (9) are driven and the strip-shaped workpiece is moved in the direction which orthogonally intersects the transport direction so that a second exposure area of the second row reaches the projection site on the workpiece carrier. The mask is positioned to the strip-shaped workpiece and exposes the second exposure area. Then, the transport of the strip-shaped workpiece and its movement in the direction which orthogonally intersects the transport direction are repeated and the first row and the second row of the strip-shaped workpiece are exposed.

2 Claims, 3 Drawing Sheets first exposure area second exposure area

EXPOSURE DEVICE FOR A STRIP-SHAPED WORKPIECE

BACKGROUND OF THE INVENTION

1. Field of the Invention

The invention relates to a device for exposure of a mask pattern on a surface of a continuous workpiece of great length (hereinafter called a "strip-shaped workpiece"), such as a film of organic compound, a lightweight metal or the like.

2. Description of Related Art

To form several different electronic components or the like on a strip-shaped workpiece, such as a film of organic compound, a lightweight metal or the like, an exposure process is performed in which a rolled strip-shaped workpiece is unrolled off a reel, transported and stopped for each predetermined pattern area, where a mask and the respective exposure area of the strip-shaped workpiece are positioned relative to one another, and afterwards a mask pattern is exposed onto the workpiece.

The strip-shaped workpiece used in the above described exposure process, conventionally, has a length of 100 m. It is transported by the workpiece being unrolled from the state rolled on the reel, exposed and wound again onto a reel. A light-sensitive resin, such as a resist, a photosensitive polyimide or the like is applied to the strip-shaped workpiece.

For exposure onto a strip-shaped workpiece, the reel, which has been wound with the strip-shaped workpiece, is located in a feed roll portion. The strip-shaped workpiece is clamped between a transport rotary roll and a pressure roll. By turning the rotary roll, it is delivered to the exposure portion.

In the exposure part, the strip-shaped workpiece is attached by vacuum in a workpiece carrier. Exposure light is emitted by a light irradiation portion, via the mask and a projection lens, onto the strip-shaped workpiece. The mask pattern, which has been formed on the mask, is exposed. After completion of exposure, the strip-shaped workpiece is released from the workpiece carrier. The rotary roller turns, and the strip-shaped workpiece is transported to the next exposure area.

The completely exposed strip-shaped workpiece is wound onto a reel which is located in a take-up roll portion.

Conventionally, the strip-shaped workpiece has a width of roughly 125 mm. Other strip-shaped workpieces were located next to one another in a row, and thus, a product was produced. Therefore, exposure was also sufficient when the mask pattern was exposed in a row.

But recently, there have been cases in which the width of the strip-shaped workpiece is large, i.e., for example, 250 mm, and in which two rows of mask patterns are to be exposed next to one another on the strip-shaped workpiece, so that more products can be produced from a roll of strip-shaped workpiece. Therefore, there is a demand for exposure of the mask pattern in two rows.

If, in a conventional device, an effort is made to expose two rows of mask patterns on a strip-shaped workpiece, the strip-shaped workpiece is transported by the reel located in the feed roll portion and first a mask pattern is exposed in the first row. After completion of the exposure of the first row the strip-shaped workpiece is wound up by a reel located in the take-up reel portion.

For exposure of the second row, the reel, onto which the strip-shaped workpiece with a first row which has already been completely exposed has been wound, is removed from the take-up roll portion and installed in the feed roll portion, i.e., the reels are interchanged. The strip-shaped workpiece is transported again by the reel and the second row is exposed.

The completely exposed strip-shaped workpiece is taken up by the reel installed in the take-up roll portion. For exposure of the second row, the same device can be used by which the first row was exposed, or also another device can be used.

Conventionally, as was described above with respect to a roll of workpiece, between starting of exposure and its completion, a process of manual "reel changing" has always arisen, causing efficiency to be poor.

When a mask is being prepared in which two rows of patterns are formed, a projection lens with twice the projection surface is prepared and the two rows are exposed together, and a roll workpiece can be exposed without "reel changing." But, an enormously large projection lens is required for this purpose. The material of a large lens is very expensive. The entire exposure device also becomes larger.

SUMMARY OF THE INVENTION

The invention was devised to eliminate the above described defects in the prior art. Therefore, a primary object of the present invention is to devise an exposure device for a strip-shaped workpiece in which several rows of mask patterns can be exposed onto a strip-shaped workpiece without the device becoming larger and without the rolls having to be exchanged.

The object is achieved in accordance with the invention as follows:

(1) In a exposure device in which patterns formed on a mask are exposed in steps onto a strip-shaped workpiece, there are a workpiece transport device for transport of the strip-shaped workpiece on a workpiece carrier in the lengthwise direction of the strip-shaped workpiece and a workpiece movement device which moves the strip-shaped workpiece on the workpiece carrier in the direction of width of the strip-shaped workpiece. A control member controls the workpiece transport device and the workpiece movement device. Transport of the strip-shaped workpiece and its movement in the direction which orthogonally intersects the transport direction are repeated. Several rows of mask patterns are exposed on the strip-shaped workpiece. In this way, several rows of mask patterns can be exposed onto a roll strip-shaped workpiece without the need to replace the rolls, without the device being made especially large and without a large projection lens with an enormous cost having to be used.

(2) A roll portion movement device is put in place; it moves a feed roll portion for arranging the strip-shaped workpiece before exposure and a take-up reel portion for arranging the strip-shaped workpiece after each exposure in the direction of the width of the strip-shaped workpiece. During transport of the strip-shaped workpiece, the strip-shaped workpiece is moved by the roll portion movement device in the direction of width such that there is no twisting in the strip-shaped workpiece.

In the following, the invention is further described using one embodiment shown in the drawing.

BRIEF DESCRIPTION OF THE DRAWINGS

FIG. 1a shows a cross-sectional detail A of the workpiece suction devices of the embodiment shown in FIG. 1.

DETAILED DESCRIPTION OF THE INVENTION

Figure 1:
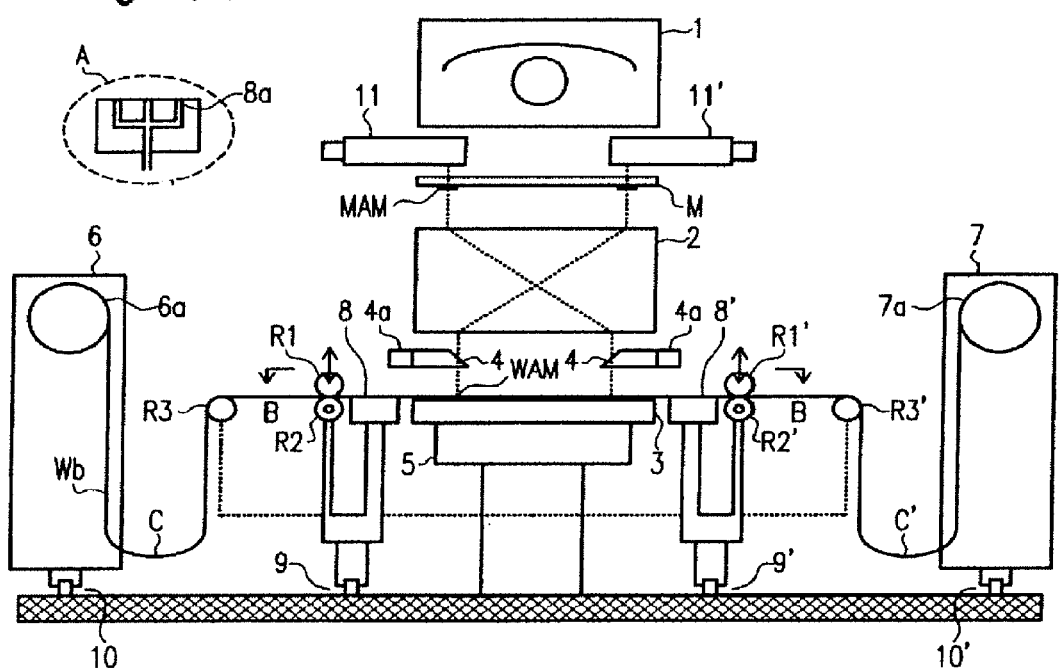
FIG. 1 is a schematic of the entire arrangement of one embodiment of an exposure device as in accordance with the invention.

FIG. 1 is a schematic of the arrangement of one embodiment of an exposure device as in accordance with the invention having a light irradiation device 1 for emission of exposure light and a mask M on which mask pattern and mask alignment marks MAM (hereinafter called only "mask marks MAM") are recorded. Between the light irradiation device 1 and the mask M, partial illumination systems 11, 11' are arranged to be insertable and removable. As is described below, when the mask marks MAM are positioned relative to the workpiece alignment marks WAM (hereinafter called only the "workpiece marks WAM") on the strip-shaped workpiece Wb, the partial illumination systems 11, 11' are inserted into the positions shown in the drawings, by which the mask marks MAM and the workpiece marks WAM are illuminated via a projection lens 2.

Furthermore, a workpiece carrier 3 has a vacuum suction device (not shown) by which the strip-shaped workpiece Wb held securely by vacuum. An X-Y-Z-θ carrier 5 drives the workpiece carrier 3 in the X-Y-Z-θ directions (X: to the right and left in the drawings, Y: to the front and back, i.e., into and out of the plane of FIG. 1, Z: the direction which orthogonally intersects the X and Y axes and runs up and down in FIG. 1, and θ: the direction of rotation around the Z-axis).

Between the projection lens 2 and the workpiece carrier 3, there are alignment units 4 which are used to position the mask M relative to the strip-shaped workpiece Wb. Each alignment unit 4 has an image recording element 4a by which the image of the mask mark MAM and the image of the workpiece mark WAM are recorded, and with which alignment of the mask relative to the strip-shaped workpiece Wb is performed.

A feed roll portion 6 is provided with a feed reel 6a which is wound in the manner of a roll with the strip-shaped workpiece Wb. Furthermore, in the feed roll portion 6, there is a movement device 10 which is arranged to be able to move to the front and back in the page of the drawings.

A take-up roll portion 7 is provided with a take-up reel 7a for winding up the strip-shaped workpiece Wb after exposure. Furthermore, in the take-up roll portion 7, there is a movement device 10' which can be moved to the front and back (in and out of the plane of FIG. 1).

The strip-shaped workpiece Wb which has been advanced by the feed reel 6a is transported via a guide roll R3, transport rolls R1 and R2 onto the workpiece carrier 3 and is positioned in the exposure area of the projection lens 2. After completion of positioning of the mask M relative to the strip-shaped workpiece Wb, exposure is performed.

The already exposed strip-shaped workpiece Wb is wound onto the take-up reel 7a via the transport rolls R1', R2' and a guide roll R3'.

In the strip-shaped workpiece Wb, between the feed reel 6a and the guide roll R3, and also between the guide roll R3' and the take-up reel 7a, there is a slack area C by which dynamic play of the strip-like workpiece is ensured when the mask is positioned relative to the workpiece, and in the movement of the workpiece described below, in the direction which orthogonally intersects the transport direction. Furthermore, the slack C prevents the strip-shaped workpiece Wb from being exposed to a stress exceeding a predetermined amount.

Each workpiece suction device 8, 8' is provided with a vacuum supply line 8a as shown in FIG. 1A. The strip-shaped workpiece Wb can be held by a suction force applied by drawing a vacuum in the vacuum feed line 8a.

The workpiece suction devices 8, 8', the rolls R1 to R3 and R1' to R3' are each installed in the movement devices 9, 9', which are engaged with a rail which has been installed on the base plate and by which they are arranged to be able to move as a unit forward and backward, into and out of the plane of FIG. 1 of the drawings. Movement in the direction which orthogonally intersects the transport direction can take place by moving these movement devices in the state in which the strip-shaped workpiece Wb is held.

Figure 2A:
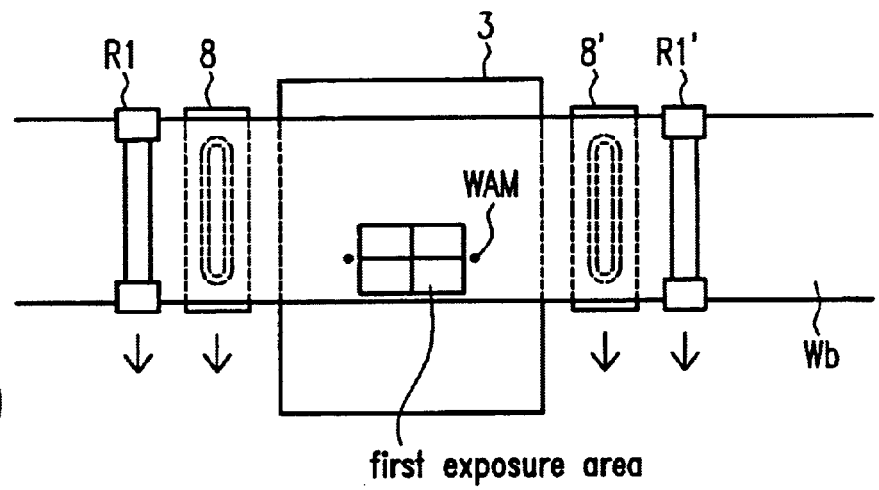
FIGS. 2(a) and 2(b) each depict exposure of a strip-shaped workpiece in the exposure device shown in FIG. 1 in views taken along line B—B thereof.
Figure 2B:
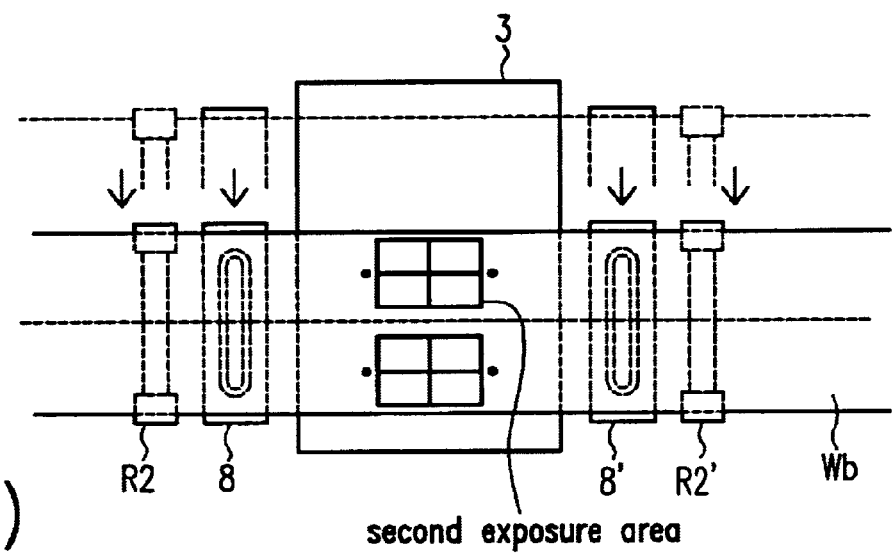

Furthermore, the rolls R1, R1' are each arranged to move in the direction of the arrows in FIGS. 2(a) & 2(b) of the drawings. For transporting of the strip-shaped workpiece Wb, the rolls R1, R1' move down, and the strip-shaped workpiece Wb is clamped between the roll R1 and the roll R2 and between the roll R1' and R2'.

FIG. 2(a) and 2(b) each show one exposure of the first row and the second row in the exposure device shown in FIG. 1 and are representations which have been viewed from the direction of line B—B in FIG. 1. FIG. 2(a) shows the state in the exposure of the first row, while FIG. 2(b) shows the state for exposure of the second row.

When the first row is exposed, a first exposure area of the first row of the strip-shaped workpiece Wb is held by suction at a site where the mask pattern is projected onto the workpiece carrier 3, as is shown in FIG. 2(a). The workpiece carrier 3 is moved by the X-Y-Z-θ carrier 5 and the mask M is positioned relative to the strip-shaped workpiece Wb. Afterwards, exposure light is emitted from the light irradiation device 1 via the mask M and the projection lens 2 onto the strip-shaped workpiece Wb. Thus, the mask pattern is transferred to the first exposure area of the strip-shaped workpiece.

After completion of exposure of the first exposure area, the vacuum applied to the workpiece at the workpiece carrier 3 is discontinued, and at the same time, a vacuum is supplied to the vacuum supply lines 8a of the workpiece suction devices 8, 8' so that the strip-shaped workpiece Wb is held at the workpiece suction devices 8, 8'. Then, the rolls R2, R2' and the rolls R3, R3' are moved in the direction of the arrows shown in FIG. 2(b), essentially by half the width of the strip-shaped workpiece Wb and a second exposure area of the second row is positioned with respect to the location where the mask pattern is projected onto the workpiece carrier 3.

The strip-shaped workpiece Wb is again held to the workpiece carrier 3 by suction. Positioning of the mask M relative to the strip-shaped workpiece Wb in the same way as described above. Afterwards, the mask pattern is transferred to the second exposure area of the strip-shaped workpiece. After completion of the exposure of the second exposure area, the strip-shaped workpiece Wb is transported and exposure of the next exposure area is performed.

Figure 3:
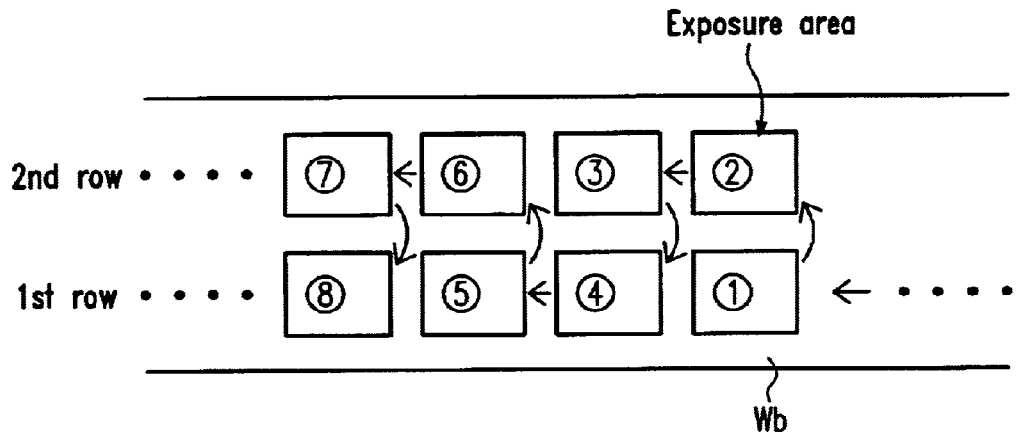
FIG. 3 is a schematic of the exposure sequences of the strip-shaped workpiece in the embodiment of the invention.

FIG. 3 is a schematic of the exposure sequence of the strip-shaped workpiece Wb in this embodiment. As is shown in the drawings, after exposure (1) of the first row is, the strip-shaped workpiece Wb is moved in the direction which orthogonally intersects the transport direction and exposure (2) of the second row is performed. Then, the strip-shaped workpiece Wb is transported to the next exposure area (3) of the second row is exposed. Afterwards the strip-shaped workpiece Wb is moved in the direction which orthogonally intersects the transport direction and (4) of the first row is exposed. Afterwards (5) to (8) are exposed in the same way.

FIG. 3 shows a case in which exposure is performed in the following sequence: movement in the transport direction→exposure of the first row→movement in the direction which orthogonally intersects the transport direction→exposure of the second row→movement in the transport direction→exposure of the second row→movement in the direction which orthogonally intersects the transport direction→exposure of the f first row→.
. .

However, if necessary, the exposure sequence can be suitably selected, for example, as follows: movement in the transport direction→exposure of the first row→movement in the direction which orthogonally intersects the transport direction→exposure of the second row→movement in the direction which orthogonally intersects the transport direction→movement in the transport direction→exposure of the first row→. . .

FIG. 3 shows a case in which two rows are exposed on the strip-shaped workpiece. But, the amount of movement of the strip-shaped workpiece in the orthogonal direction can be chosen in a suitable manner and on the strip-shaped workpiece three or more rows can be exposed.

Figure 4:
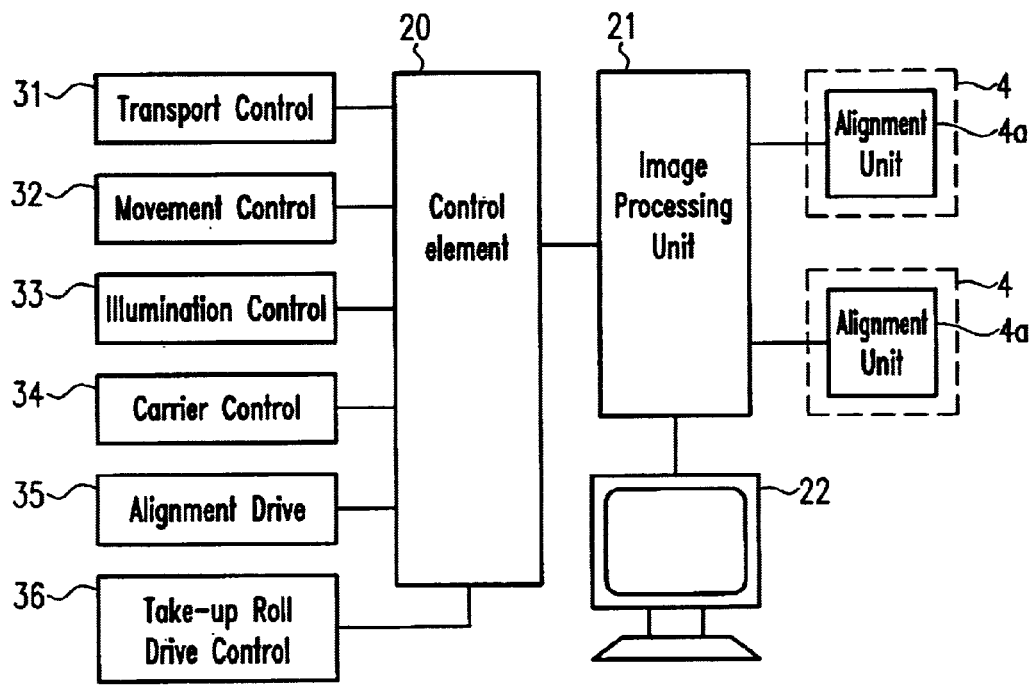
FIG. 4 is a block diagram of an arrangement of a control device of the exposure device in the embodiment of the invention.

FIG. 4 is a schematic of the arrangement of a control device of the exposure device in this embodiment. In the figure, an alignment unit 4 has an image recording element 4a for recording the mask mark MAM and the workpiece mark WAM, as was described above. The images of the alignment marks recorded by the image recording element 4a are sent to an image processing portion 21 and there they are subjected to image processing, by which their positions are determined. Furthermore, a monitor 22 displays the images recorded by the image recording element 4a.

A workpiece transport control device 31 controls transporting of the strip-shaped workpiece Wb. The drive of the transport rolls R1, R2, R1' and R2' transports the strip-shaped workpiece Wb in the lengthwise direction of the workpiece. Furthermore the workpiece movement control device 32 moves the strip-shaped workpiece Wb in the direction which orthogonally intersects the transport direction. The workpiece suction devices 8, 8' formed therewith in one piece and the rolls R1 to R3 and R1' to R3' are moved by the movement devices 9, 9'.

A partial illumination system drive device 33 controls the removal and insertion of the partial illumination systems 11, 11'. Furthermore, a carrier drive device 34 drives the workpiece carrier 3 and an alignment system drive device 35 controls the positions of the alignment units 4.

A feed take-up roll part drive control device 36 moves the feed roll portion 6 and the take-up roll portion 7 by means of the positioned movement device 10, 10'.

A control element 20 controls transporting, moving and positioning of the strip-shaped workpiece Wb via the above described control devices and drive devices, and the strip-shaped workpiece Wb is moved such that exposure can be performed in the sequence which is shown in FIG. 3.

When the strip-shaped workpiece Wb is moved in the direction which orthogonally intersects the transport direction, in the time interval up to the next transport of the strip-shaped workpiece Wb in the transport direction, the feed roll portion 6 and the take-up roll portion 7 are moved by the same distance by the device 36 in the direction in which the strip-shaped workpiece Wb has moved.

Furthermore, based on the positions of the mask marks MAM and the workpiece marks WAM which have been determined in the image processing portion 21, the alignment of the mask M relative to the respective pattern area of the strip-shaped workpiece Wb and the exposure of the strip-shaped workpiece Wb are controlled.

In the following, exposure is described in this embodiment.

(1) The strip-shaped workpiece Wb is clamped between the roll R1 and the roll R2 and between the roll R1' and R2'. The strip-shaped workpiece Wb is transported. When the first exposure area of the first row is positioned with reference to the position where the mask pattern is projected on the workpiece carrier 3, the strip-shaped workpiece Wb is held by suction by the workpiece carrier 3, as is shown in FIG. 2(a). In the transport, alignment and exposure of the strip-shaped workpiece Wb, a vacuum is not supplied to the vacuum supply lines 8a of the workpiece suction devices 8, 8'.

(2) The rolls R1 and R1' are raised and the clamping of the strip-shaped workpiece Wb is ended. The removed alignment units 4 and partial illumination systems 11 are inserted into the exposure area and the mask M is positioned relative to the strip-shaped workpiece Wb.

Alignment light (exposure light) is emitted by the partial illumination systems 11, 11'. The mask marks MAM are projected via the projection lens 2 onto the strip-shaped workpiece Wb. The respective image recording element 4a of the alignment unit 4 determines the positions of the projected image of the mask mark MAM and the workpiece mark WAM and stores their positions. The control element 20 drives the X-Y-Z-θ carrier by means of the device 34 such that the mask marks MAM and the workpiece marks WAM are positionally aligned with one another and the workpiece carrier 3 is moved. When the strip-shaped workpiece Wb is moved in the X-Y-θ directions in the above described positioning, the above described slack C absorbs the stress of twisting the strip-shaped workpiece Wb. After completion of positioning the alignment units 4 and the partial illumination systems 11 are removed to the outside of the exposure area.

Positioning of the mask M relative to the strip-shaped workpiece Wb can also take place in the manner described below.

The alignment units 4 are each provided with a second partial illumination system (nonexposure light) for illuminating the workpiece marks WAM. Alignment is performed in the sequence described below.

1) Alignment light (exposure light) is emitted by the partial illumination systems 11, 11'. The mask marks MAM are projected onto the strip-shaped workpiece Wb via the projection lens 2.

2) The projected image of the mask mark MAM is determined by the respective image recording element 4a of the alignment unit 4 and its position is stored. Emission of the alignment light from the partial illumination systems 11, 11' is stopped.

3) The respective workpiece mark WAM is illuminated by the second partial illumination system (nonexposure device) and is determined by the image recording element 4a. The X-Y-Z-θ carrier 5 is driven in the X-Y-θ directions such that the stored mask marks MAM and the determined workpiece marks WAM are aligned with one another. The workpiece carrier 3 is moved.

(3) The light exposure device 1 emits exposure light via the mask M and the projection lens 2 onto the strip-shaped workpiece Wb. The mask pattern is transferred to the strip-shaped workpiece-Wb. Thus, the exposure of the first exposure area is ended.

(4) Vacuum is supplied to the vacuum supply lines 8a of the workpiece suction devices 8, 8', and the strip-shaped workpiece Wb is held. At the same time, rolls R1 and R1' are released. The strip-shaped workpiece Wb can thus be clamped between the rolls R1 and R1' or the rolls can remain open. Vacuum-holding of the workpiece carrier 3 is ended. The Z-carrier of the X-Y-Zθ carrier 5 very slightly lowers the workpiece carrier 3. Air flows out of the vacuum opening of the workpiece carrier 3.

(5) By means of the device 32, the control element 20 moves the devices 8, 8', the rolls R2, R2' and the rolls R3, R3' essentially by half the width of the strip-shaped workpiece, as shown in FIG. 2(b). The second exposure area of the second row is positioned at the location onto which the mask pattern on the workpiece carrier 3 is projected.

(6) Flow of air out of the workpiece carrier 3 is stopped. A vacuum is supplied to the workpiece carrier 3. The workpiece carrier 3 is raised by the amount of it was lowered. The strip-shaped workpiece Wb is held by vacuum at the carrier 3. The vacuum supply to the vacuum supply lines 8a of the workpiece suction devices 8, 8' is stopped.

(7) In the same way in (2) to (3), positioning of the mask M relative to the strip-shaped workpiece Wb and exposure of the second exposure area are performed.

(8) Since, upon completion of exposure of the second exposure area, the strip-shaped workpiece Wb has been moved in the vicinity of the exposure area only in the direction of the width of the strip-shaped workpiece Wb, twisting arises in the loose part C. Since a large twisting stress arises in this state with respect to the strip-shaped workpiece Wb, when the strip-shaped workpiece Wb is transported, it is possible for serpentines, deformations, damages and the like of the strip-shaped workpiece WB to occur.

Therefore, by means of the device 36, the control member 20 drives the movement devices 10, 10' and moves the feed roll portion 6 and the take-up roll portion 7 by the same amount of movement in the same direction as the direction in which the strip-shaped workpiece Wb has moved.

This motion of the feed roll portion 6 and the take-up roll portion 7 can be accomplished at the same time as the movement of the workpiece suction devices 8, 8' according to (5). However, it can be done at any time if it takes place in the time interval in which the movement of the strip-shaped workpiece Wb takes place by the workpiece suction devices 8, 8', exposure of the second exposure area is ended and the strip-shaped workpiece Wb is transported to the next, third exposure area.

(9) The rolls R1 and R1' are lowered. The strip-shaped workpiece Wb is clamped between the rolls R2 and R2'. Vacuum-holding of the workpiece carrier 3 is ended. The Z-carrier of the X-Y-Zθ carrier 5 lowers the workpiece carrier 3 very slightly. Air flows out of the vacuum suction opening of the workpiece carrier 3. The rolls R2' and R1' turn and transport the strip-shaped workpiece Wb. In this way, the third exposure area of the second row onto the workpiece carrier 3 is transported.

(10) The above described process is repeated. The exposure areas of the first and second rows are exposed alternately, for example, according to FIG. 3.

In the case in which in the strip-shaped workpiece Wb the workpiece marks WAM are not formed beforehand, i.e., in the case in which, in the strip-shaped workpiece Wb, an initial mask pattern is exposed, it is not necessary to position the mask relative to the workpiece according to (2) and (7).

Action of the Invention

As was described above, the following effects can be achieved as in accordance with the invention:

(1) By moving the strip-shaped workpiece in the direction which orthogonally intersects the transport direction, several rows of mask patterns can be exposed without reel replacement on a roll of strip-shaped workpiece.

(2) Solely by the fact that there is a movement device for moving the strip-shaped workpiece in the direction which orthogonally intersects the transport direction and its movement space is ensured, on a roll of strip-shaped workpiece, several rows of mask patterns can be exposed without the device being made especially large and a large projection lens with extremely high costs having to be used.

I claim:

1. Exposure device for a strip-shaped workpiece, with which patterns formed on a mask are exposed in steps onto a strip-shaped workpiece, comprising an exposure means for illuminating mask patterns onto a strip-shaped workpiece, a workpiece transport device having workpiece carrier for transporting of the strip-shaped workpiece on the workpiece carrier in a lengthwise direction of the strip-shaped workpiece, a workpiece movement device which moves the strip-shaped workpiece on the workpiece carrier in a widthwise direction of the strip-shaped workpiece, and a control device which executes drive control of the workpiece transport device and the workpiece movement device, said control device having means for causing the strip-shaped workpiece to be transported and moved by the workpiece transport device and the workpiece movement device in a repeated series of steps by which rows of mask patterns are exposed by the exposure means onto the strip-shaped workpiece further comprising a feed roll portion for arranging the strip-shaped workpiece before exposure, a take-up roll portion for arranging the strip-shaped workpiece after exposure, and a roll portion movement device for moving the feed roll portion and the take-up roll portion in the widthwise direction of the strip-shaped workpiece, and wherein said control means includes means for causing the roll portion movement device to move the feed roll portion and the take-up roll portion in said widthwise direction of the strip-shaped workpiece before starting to transport the strip-shaped workpiece in the lengthwise direction of the strip-shaped workpiece.

2. Exposure device for a strip-shaped workpiece as claimed in claim 1, wherein the roll portion movement device has vacuum means for holding the strip-shaped workpiece by suction during widthwise movement thereof.

* * * * *